United States Patent
Saito

(10) Patent No.: US 7,947,187 B2
(45) Date of Patent: May 24, 2011

(54) METHOD OF MANUFACTURING PIEZOELECTRIC RESONATOR

(75) Inventor: Takefumi Saito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 917 days.

(21) Appl. No.: 11/901,511

(22) Filed: Sep. 18, 2007

(65) Prior Publication Data

US 2008/0073318 A1  Mar. 27, 2008

(30) Foreign Application Priority Data

Sep. 21, 2006  (JP) .................................. 2006-256185

(51) Int. Cl.
    *H01L 41/22* (2006.01)
(52) U.S. Cl. ............... 216/11; 216/13; 216/41; 216/49; 216/83; 216/100; 216/108; 29/25.35
(58) Field of Classification Search .................. None
    See application file for complete search history.

(56) References Cited

U.S. PATENT DOCUMENTS

| 7,596,851 B2 * | 10/2009 | Takahashi ........... 29/594 |
| 7,857,983 B2 * | 12/2010 | Hirano ............... 216/13 |
| 2008/0054763 A1 * | 3/2008 | Kizaki ................ 310/370 |

FOREIGN PATENT DOCUMENTS

| JP | 2002-76806 | 3/2002 |
| JP | 2004-120351 | 4/2004 |
| JP | 2004-304577 | 10/2004 |

* cited by examiner

Primary Examiner — Anita K Alanko
(74) Attorney, Agent, or Firm — Jordan and Hamburg LLP

(57) ABSTRACT

When forming an opening conforming to a groove of a quartz resonator in a metal film serving as a mask of the quartz resonator by conducting etching, the outer periphery of the metal film is wavingly etched. Therefore, when the groove is formed on the quartz resonator, the quartz resonator is formed according to the above-described metal film, which results in appearance defects or dimension defects. In order to solve the problems, the outer shape of the metal film is formed smaller than the outer shape of the quartz resonator before forming the opening conforming to the groove of the quartz resonator in the metal film, then etching of the metal film and etching of the quartz resonator are performed.

3 Claims, 11 Drawing Sheets

100 QUARTZ RESONATOR

100 QUARTZ RESONATOR

METHOD OF MANUFACTURING PIEZOELECTRIC RESONATOR

BACKGROUND OF THE INVENTION

1. Field of the Invention

The present invention relates to a technology for manufacturing a piezoelectric resonator made of, for instance, quartz crystal or the like.

2. Description of the Related Art

The tuning fork type quartz resonator has long been adopted as a signal source for pacing a wrist watch owing to its being compact, inexpensive and having a low power consumption, and the uses thereof are still expanding. Recently, the CI (crystal impedance) value of this quartz resonator is required to be as small as possible, and a quartz resonator with a groove formed therein has been used for this purpose.

The tuning fork type quartz resonator 100 is provided with a base 1 and a pair of vibrating arms 2a and 2b arranged in the base 1, as shown in FIG. 7. Grooves 31 and 32 are respectively arranged on both main surfaces of the vibrating arms 2a and 2b, and exciting electrodes (not shown) to cause tuning fork vibration based on bending vibration are formed to these grooves 31, 32 and the vibrating arms 2a, 2b. By applying an electric current through the exciting electrodes, oscillation occurs in the quartz resonator 100.

The above-described quartz resonator is manufactured according to the following process (refer to Patent Document 1). FIGS. 8A to 8E, FIGS. 9F to 9I, and FIG. 11 are views showing the cross sectional portion along A-A' line in FIG. 7. First, after polishing and cleaning a cutout quartz wafer 10, a metal film 11 is formed by the sputtering method (FIG. 8A). The metal film 11 consists of gold (Au) deposited on a backing film made of, for instance, chromium (Cr).

Then, after forming a resist film 12 on the surface of the metal film 11 (FIG. 8B) exposure and development processing are conducted to form a pattern having the shape of the quartz resonator 100, that is the shape of a tuning fork on the resist film 12 (FIG. 8C). Then, after it is immersed into a potassium iodide (KI) solution or the like to perform etching so that a pattern corresponding to the pattern of the resist film 12 is formed on the metal film 11, the resist film 12 is peeled off (FIG. 8D).

Next, a resist film 13 is formed on the whole surface of the quartz wafer 10 (FIG. 8E), and the resist film 13 at the parts corresponding to an opening of the pattern of the metal film 11 and the grooves 31, 32 shown in FIG. 7 is peeled off (FIG. 9F).

Thereafter, the quartz wafer 10 is immersed in hydrofluoric acid to form the outer shape of a quartz piece 17 using the metal film 11 as a mask (FIG. 9G). At this time, the quartz piece 17 is etched such that it becomes a little smaller than the outer shape of the metal film 11, which makes the end of the metal film 11 to be exposed. Next, the metal film 11 at the part corresponding to the groove 31 in FIG. 7 is etched (FIG. 9H). By this etching, the end of the metal film 11 exposed by the previously described etching of the quartz wafer 10 is etched starting from the quartz piece 17 side so as to be nearly the same size as the outer shape of the quartz piece 17. Then the quartz piece 17 is immersed in hydrofluoric acid to form the groove 31 on both main surfaces of the quartz piece 17 (FIG. 9I). Since the outer shape of the metal film 11 is formed in nearly the same dimension as that of the quartz piece 17 by the previously described etching of the metal film 11, the outer shape of the quartz piece 17 is etched a little smaller than that of the metal film 11, similarly to the etching of the quartz wafer 10 in the above-described FIG. 9G.

Though the quartz resonator 100 is manufactured according to the above-described manufacturing method, this method has the following disadvantages. The quartz resonator 100 formed in FIG. 9I is wavy at the edges of the outer shape as shown in FIG. 10, which results in appearance defect and dimensional defect. In addition, the CI value having a close relation to the outer shape of the quartz resonator 100 is also found to increase. The reason for this is considered as follows.

As described above, in FIG. 9G, the quartz wafer 10 is etched such that the end of the pattern of the metal film 11 and the end of the resist film 13 stand alone independently of the end of the quartz piece 17 (not held by the end of the quartz piece 17), as shown in FIG. 11A. Accordingly, the end of the pattern of the metal film 11 and the end of the resist film 13 are sometimes partially bent toward the quartz piece 17 side and stick to the quartz piece 17 due to the stirring of the etching solution or shaking of the quartz piece 17 as shown in FIG. 11B. Since the area of the metal film 11 coming into contact with the etching solution differs between the part where the metal film 11 and the resist film 13 are bent toward the quartz piece 17 side and the part where they stand alone toward outside of the end of the quartz piece 17 (the contact area of the former is smaller), the dimension of the metal film 11 is forced to vary at the time after etching of the metal film 11 in FIG. 9H as shown in FIG. 11C. Then, the quartz piece 17 is etched according to the outer shape of the metal film 11 in FIG. 9I. This is considered to be the reason why the outer shape line of the quartz resonator is wavy.

Patent Document 2 describes technology to form a resist film having a dimension smaller than that of a metal film formed on the quartz wafer. However, no consideration is given to the dimension defect of the above-described quartz piece.

[Patent Document 1] Japanese Patent Application Laid-open No. 2002-76806 ((0094) to (0113), FIG. 9 to FIG. 13)

[Patent Document 2] Japanese Patent Application Laid-open No. 2004-120351 ((0020) to (0023), FIG. 1 and FIG. 2)

SUMMARY OF THE INVENTION

The present invention has been achieved under such a circumstance, and the object of the present invention is to provide a method of manufacturing a piezoelectric resonator capable of obtaining a preferable shape for the outer shape of a piezoelectric resonator.

In a method of manufacturing a piezoelectric resonator of present invention provided with grooves formed on each of a plurality of vibrating arms extending from the base, the method includes the steps of:

forming a metal film on the surface of a substrate, a piezoelectric substrate;

forming a first resist film patterned so as to retain the shape of the piezoelectric resonator on the surface of the metal film to form a pattern on the metal film by etching;

peeling off the above-described whole first resist film;

forming a second resist film having a pattern formed such that the edge thereof is positioned inside of the edge of the pattern of the above-described metal film by 3 μm to 12 μm at least at the part corresponding to the vibrating arm, and the part conforming to the groove of the vibrating arm is opened;

next, forming the outer shape of the piezoelectric resonator using the above-described metal film as a mask by bringing the above-described substrate into contact with the etching solution;

etching to remove the metal film at the part corresponding to the groove of the above-described vibrating arm and to remove the metal film outside of the outer shape of the above-described second resist film, using the above-described second resist film as a mask; and etching the outer shape of the vibrating am to a shape conforming the outer shape of said metal film by bringing said substrate into contact with an etching solution to form grooves respectively in said plural vibrating arms and to remove the part extending to the outside of the outer edge of the metal film on the vibrating arm using the above-described metal film as a mask.

In the above-described method for manufacturing the piezoelectric resonator, it is preferable that the edge of the vibrating arms obtained by the step of the etching the outer shape of the vibrating arms so as to conform to the outer shape of the above-described metal film is positioned outside of the edge of the pattern of the second resist film by, for instance, 1 μm to 4 μm.

A preferable method of manufacturing the above-described piezoelectric resonator after the steps of forming respective grooves in the above described plural vibrating arms and etching the outer shape of the vibrating arm into a shape conforming to the outer shape of the above-described metal film, further including the steps of:

removing the above-described resist film and the metal film;

forming a metal film to serve as an electrode in the area including the grooves formed on the above-described plural vibrating arms;

forming an electrode pattern by etching the metal film by forming a resist film patterned on the surface of the metal film; and peeling off the above-described whole resist film.

Further, in the method of manufacturing the above-described piezoelectric resonator, the piezoelectric resonator is preferably formed with, for instance, a tuning fork type quartz piece.

According to the present invention, when forming grooves in the piezoelectric resonator, the outer shape of the metal film to be used as a mask is made smaller than the dimension of the outer shape of the piezoelectric resonator. Accordingly, the metal film can be etched so that the edge line of the patter is straight. Therefore, the outer shape of the piezoelectric resonator is formed so as to conform to the outer shape of the metal film, which results in reduction of the dimension defect of the outer shape of the piezoelectric resonator.

DETAILED DESCRIPTION OF THE PREFERRED EMBODIMENT(S)

Figure 7:
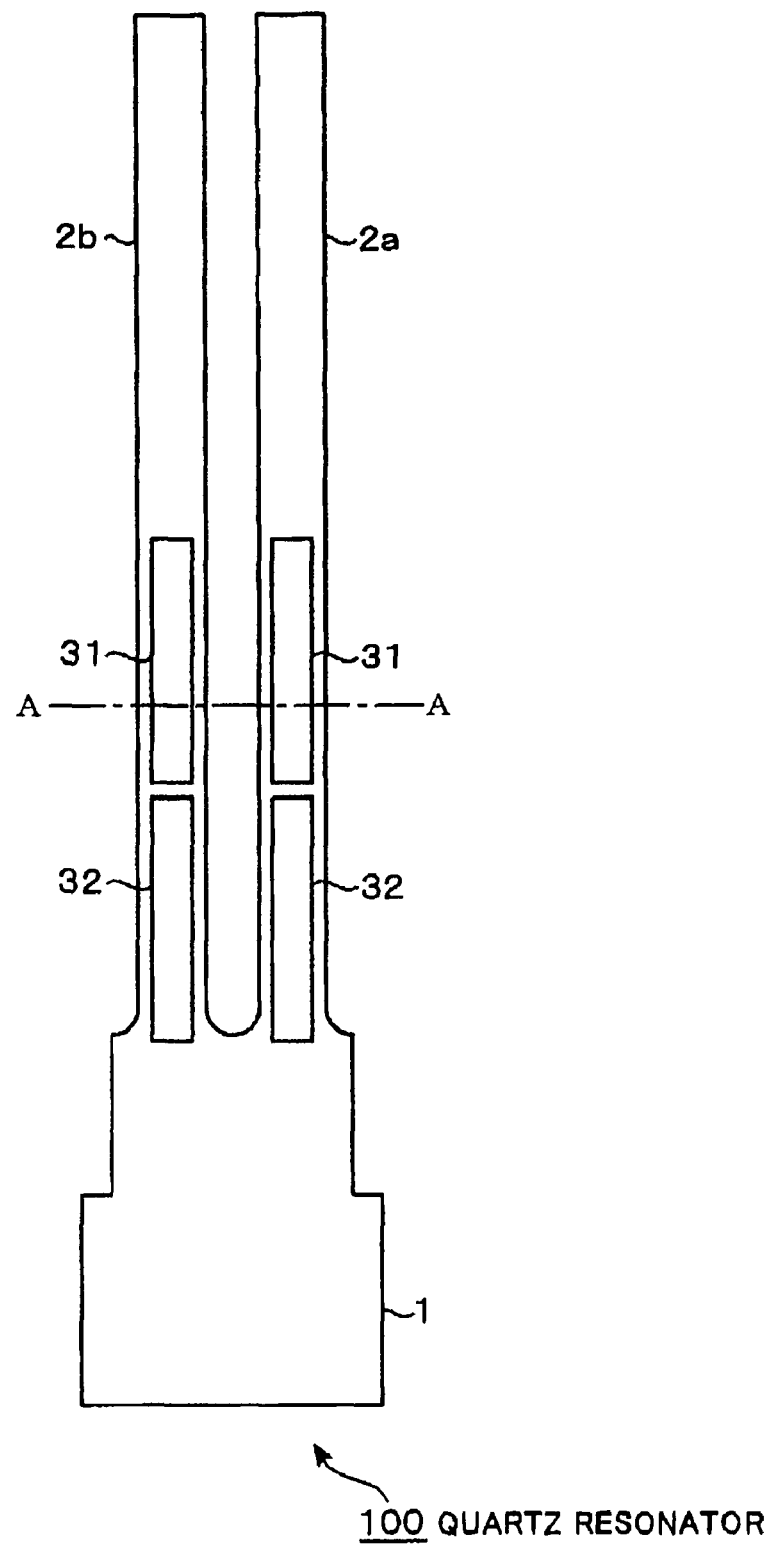
FIG. 7 is a schematic plan view showing an example of the tuning fork type quartz resonators.
Figure 8A:
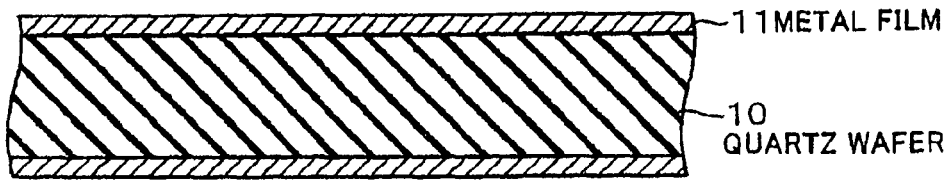
FIGS. 8A, 8B, 8C, 8D and 8E show a method of manufacturing a tuning fork type quartz resonator as shown in FIG. 7 and show cross-sectional portions taken along line A-A in FIG. 7.
Figure 8B:
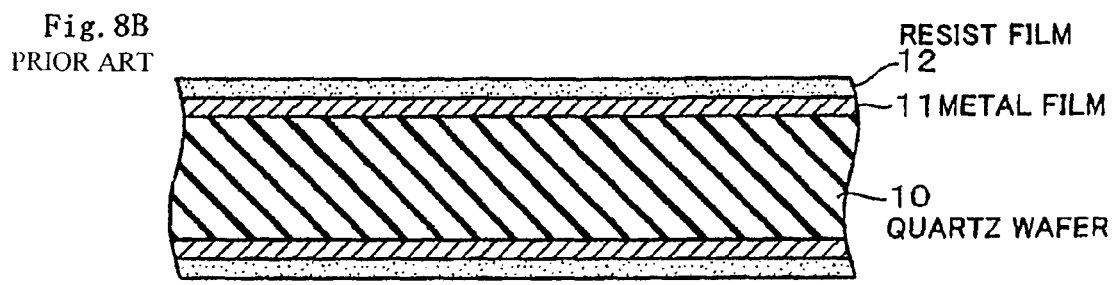
Figure 8C:
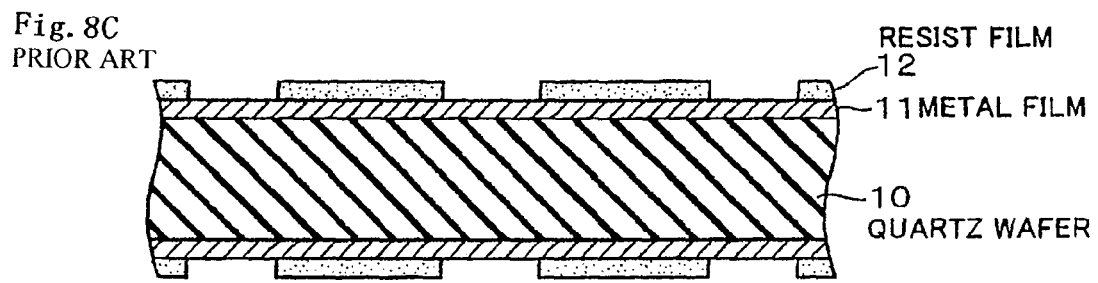
Figure 8D:
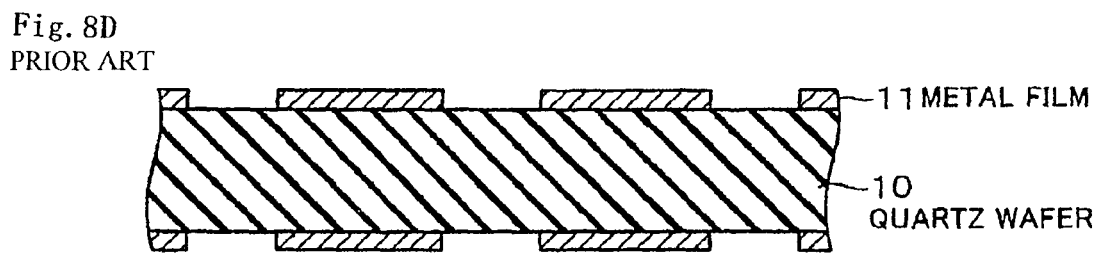
Figure 8E:
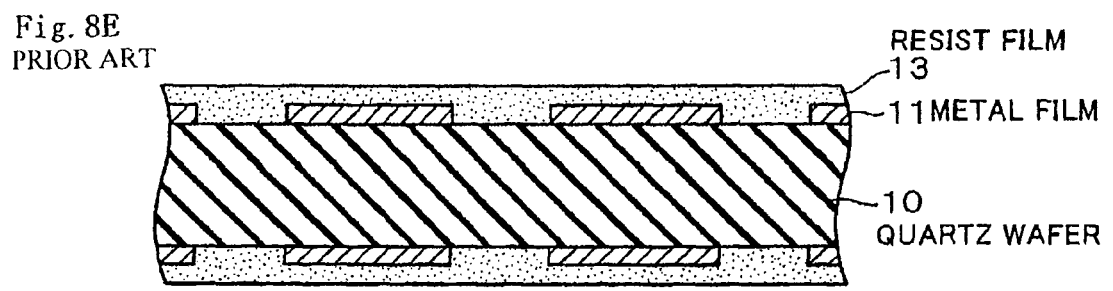
Figure 9F:
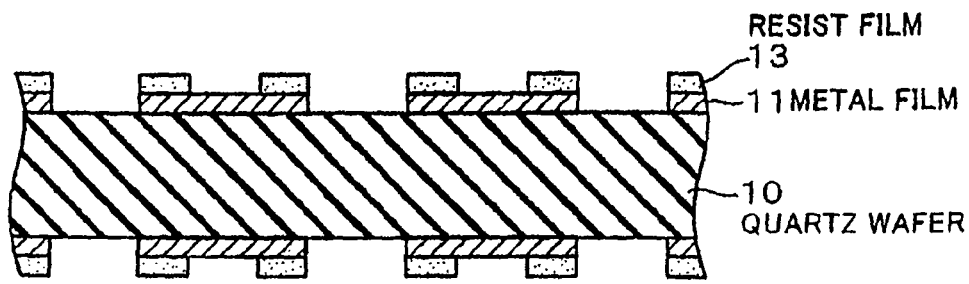
FIGS. 9F, 9G, 9H and 9I show a method of manufacturing a tuning fork type quartz resonator as shown in FIG. 7 and show cross-sectional portions taken along line A-A in FIG. 7.
Figure 9G:
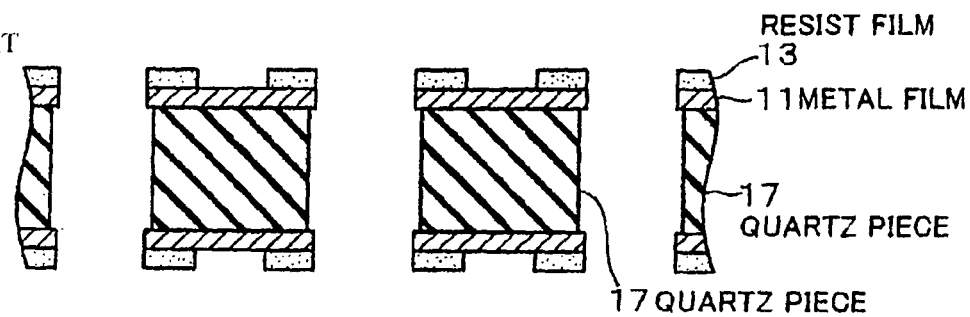
Figure 9H:
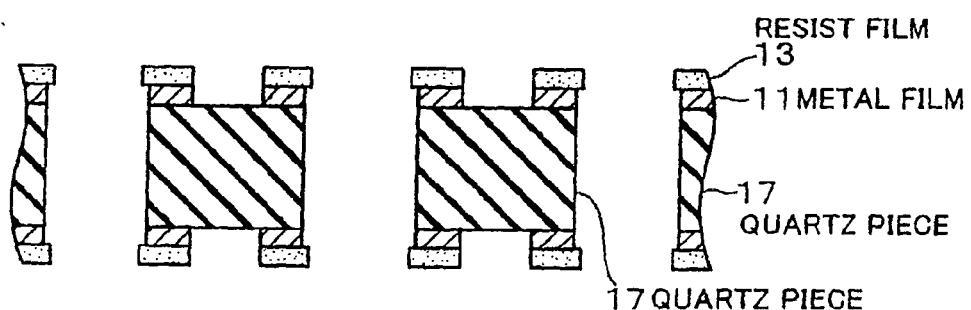
Figure 9I:
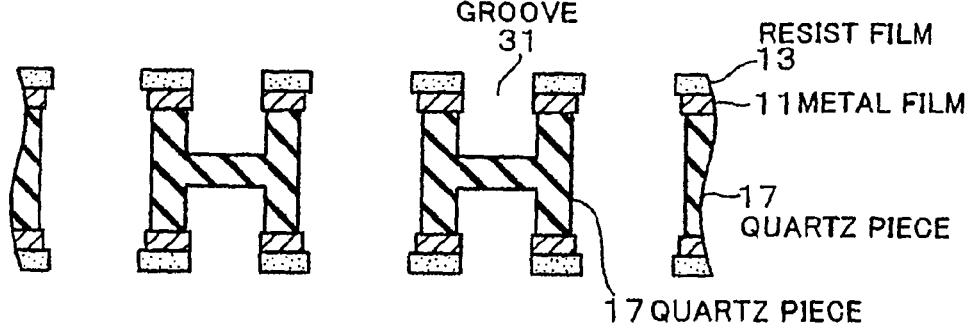
Figure 10:
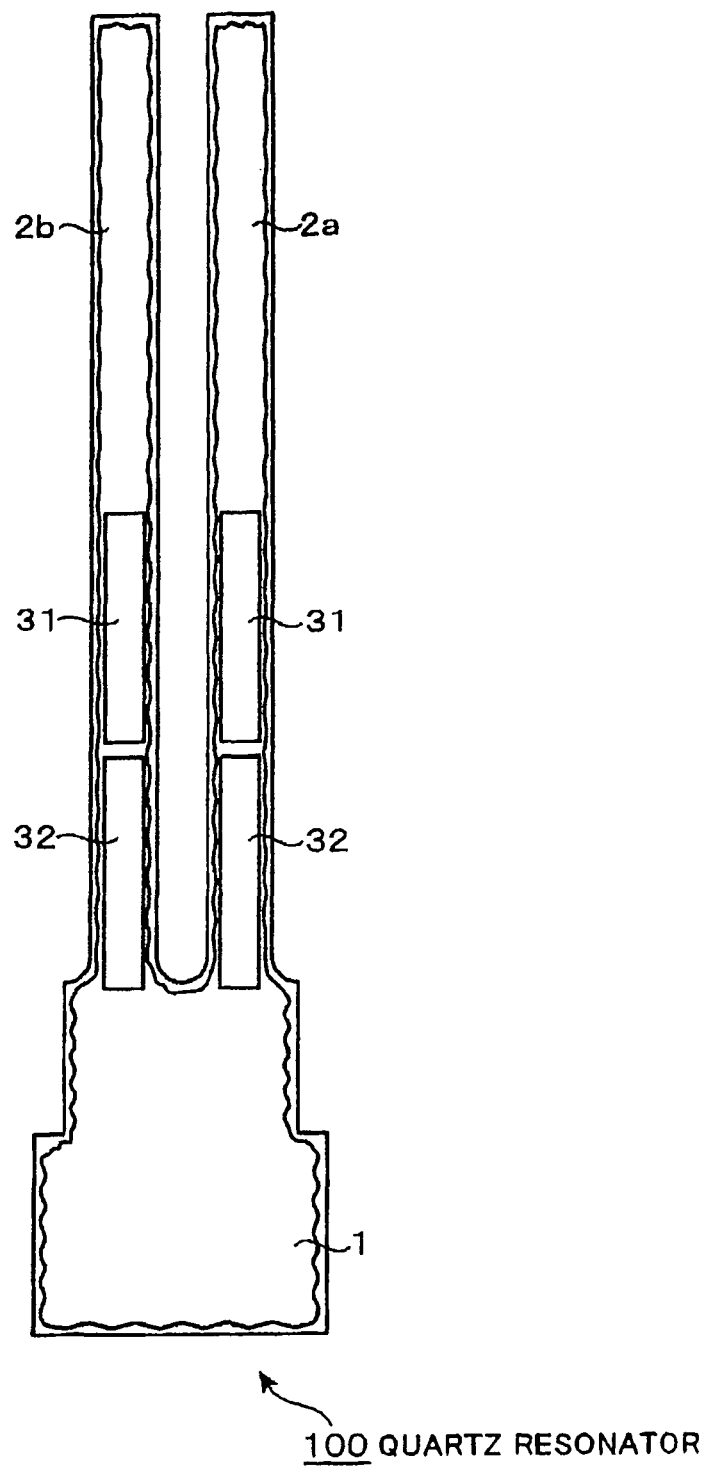
FIG. 10 is a view showing a conventional tuning fork type quartz resonator.
Figure 11A:
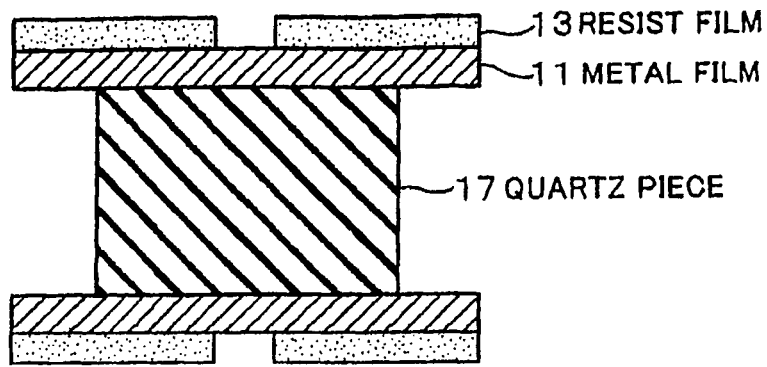
FIGS. 11A, 11B and 11C show a method of manufacturing a tuning fork type quartz resonator as shown in FIG. 7 and show cross-sectional portions taken along line A-A in FIG. 7.
Figure 11B:
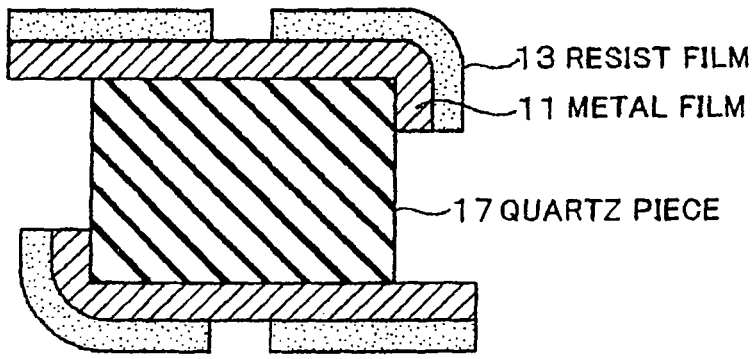
Figure 11C:
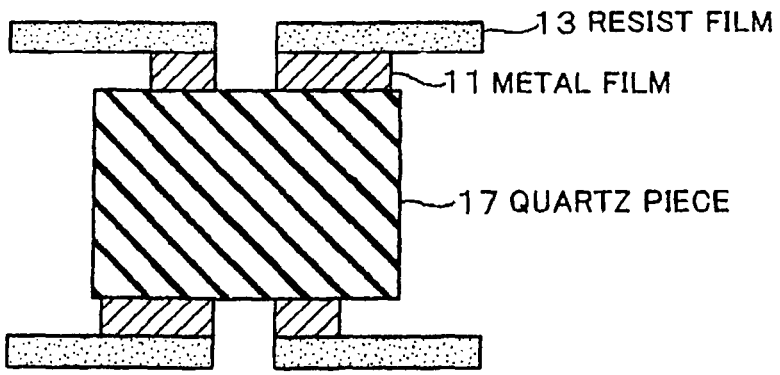

An embodiment of the present invention will be explained with reference to FIG. 1 next. Note that since a quartz resonator 5 relating to this embodiment has the same structure as the above-described quartz resonator 100 shown in FIG. 7, explanation of repeated portions will be omitted.

Figure 1:
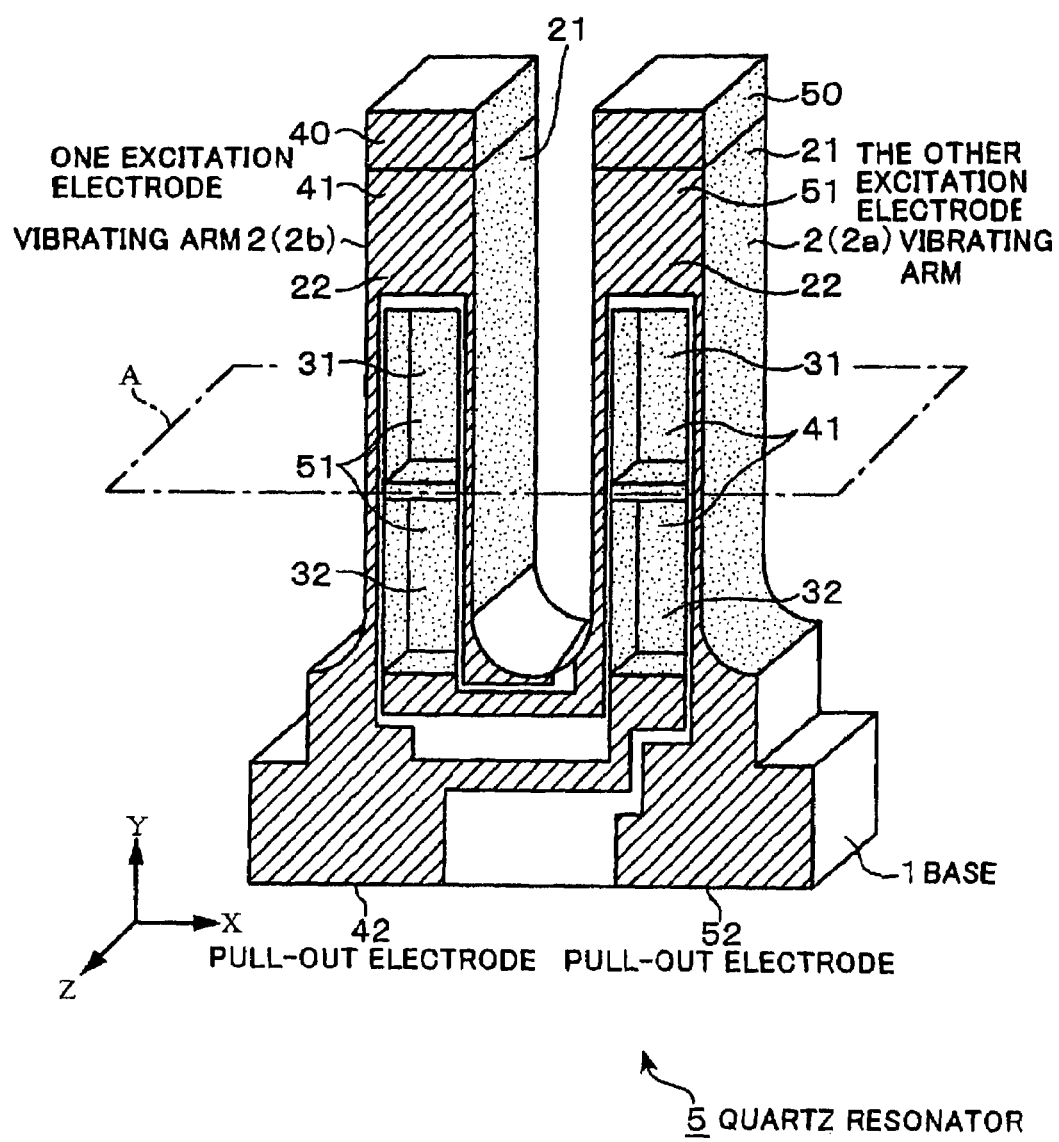
FIG. 1 is a perspective view showing an example of a tuning fork type quartz resonator relating to an embodiment of the present invention.

As shown in FIG. 1, one exciting electrode 41 and the other exciting electrode 51 making a pair are formed on the quartz resonator 5. One exciting electrode 41 is formed on the whole inner surfaces of two grooves 31 and 32 of the vibrating arm 2a, a bridge between these grooves 31 and 32, and the upper part of the groove 31 on both side surfaces 21, 21 and main surfaces 22, 22 (front side and back side) of the vibrating arm 2b. The other exciting electrode 51 is formed on the whole inner surfaces of two grooves 31 and 32 of the vibrating arm 2b, the part between these grooves 31 and 32, and the upper part of the groove 31 on both side surfaces 21, 21 and main surfaces 22, 22 (front side and back side) of the vibrating arm 2a.

On the surface of the base 1, an electrode pattern composed of a pull-out electrode 42 is formed so as to electrically connect between these exciting electrodes 41, and at the same time, an electrode pattern composed of a pull-out electrode 52 is formed so that the other exciting electrodes 51 are electrically connected to each other.

Adjusting weights 50 and 40 made of a metal film are formed respectively on the tips of the vibrating arms 2a and 2b, and the oscillation frequency of the quartz resonator 5 can be adjusted by adjusting the weight. The adjusting weights 50 and 40 are parts of the exciting electrodes 51 and 41, but differ from the electrodes at other parts in, for example, the film thickness and the material thereof. In other words, the vibrating arms 2a and 2b have the same structure except for the arrangement of the pull-out electrodes 42 and 52 being opposite to that of the exciting electrodes 41 and 51 from each other. Note that the area expressed by slanting lines in FIG. 1 is to distinguish the electrode pattern and not to express a cross section.

The method of manufacturing the quartz resonator 5 shown in FIG. 1 will be explained next with reference to FIGS. 2 to 4. Note that FIGS. 2 to 4 indicate a plane corresponding to a section of the quartz resonator 5 on a plane A passing through the groove 31 parallel to the x-z plane in FIG. 1.

Figure 2A:
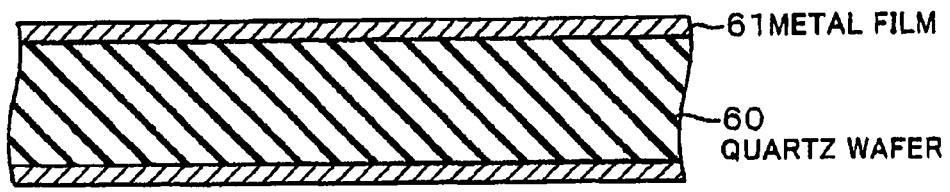
FIGS. 2A, 2B, 2C, 2D and 2E show an example of a method of manufacturing a quartz resonator as shown in FIG. 1 and show sections of the quartz resonator on a plane A passing through the groove 31 parallel to the x-z plane in FIG. 1.
Figure 2B:
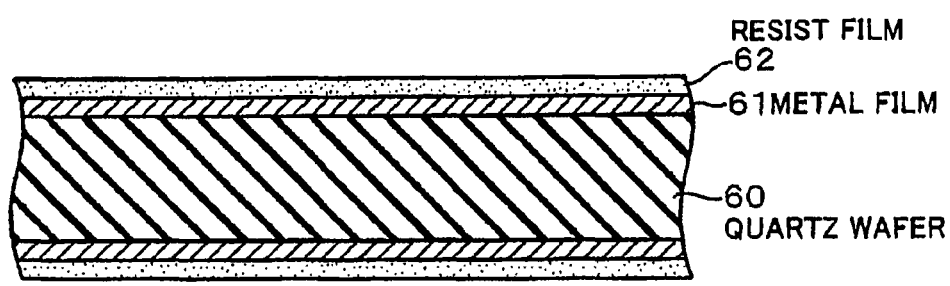

First, after polishing and cleaning a quartz wafer 60 which is a cut out substrate, a metal film 61 is formed by the sputtering method (FIG. 2A). The metal film 61 consists of gold (Au) deposited on a backing film made of, for instance, chromium (Cr).

Figure 2C:
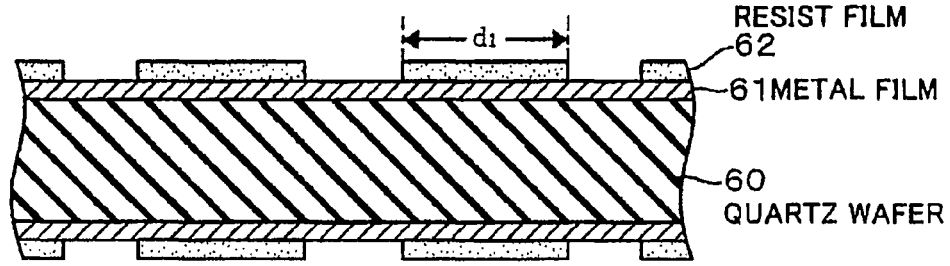
Figure 2D:
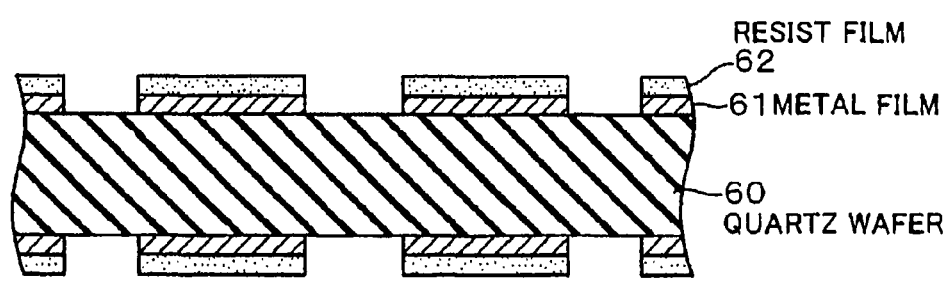
Figure 2E:
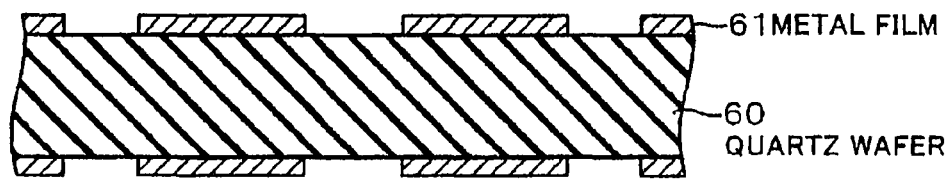

Then, after forming a resist film 62 being a photoresist layer on the metal film 61 by, for instance, the spray method (FIG. 2B), exposure and development processing are conducted to pattern the resist film 62 so as to form in the shape of a quartz piece 65, namely the shape of a tuning fork (FIG. 2C). The dimension d1 of the pattern formed on the resist film 62 in FIG. 2C corresponds to the dimension in the x direction of the vibrating arms 2a and 2b. Thereafter, the quartz wafer 60 is immersed in a potassium iodide (KI) solution serving as a metal etching solution to etch the metal film 61 so as to obtain a pattern conforming to the resist film 62 (FIG. 2D). Then, the resist film 62 is completely peeled off (FIG. 2E).

After forming a resist film 63 on the surface of the quartz wafer 60 by, for instance, the spray method (FIG. 3F) again, exposure and development processing are conducted to form a resist mask. The resist mask conforms to the tuning fork shape of the quartz piece 65, and the edge thereof is positioned a little inside, for instance, by 7.5 μm inside of the edge of the metal film 61. In other words, the resist mask (resist film 63) is formed so to speak in the next smaller size than the metal film 61, and further, an opening is formed at the position conforming to the groove in the vibrating arms 2a and 2b. The dimensions of the part relating to the vibrating arms 2a and 2b are as follows. The width d2 of the mask part of the resist mask (resist film 63) is each 7.5 μm smaller than the width d1 of the metal film 61 on both right and left edges. The width d2 of the mask part of the resist mask (resist film 63) is designed to be, for instance, 5 μm smaller than the width d3 of the vibrating arms 2a and 2b obtained by etching the quartz piece 65 on both right and left edges using the resist mask and the metal film 61 as a mask in the following step.

Figure 3F:
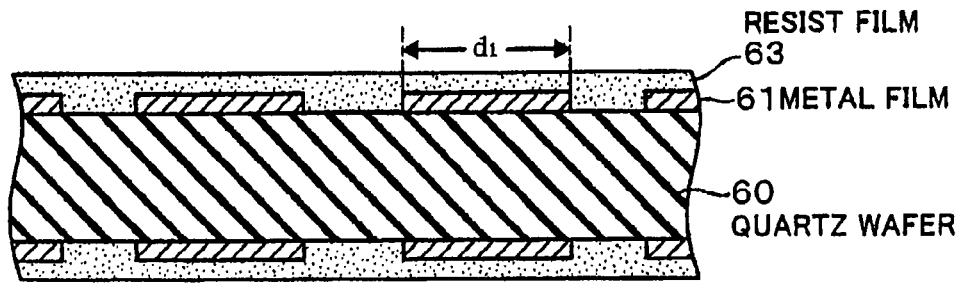
FIGS. 3F, 3G, 3H, 3I and 3J show an example of a method of manufacturing a quartz resonator as shown in FIG. 1 and show sections of the quartz resonator on a plane A passing through the groove 31 parallel to the x-z plane in FIG. 1.
Figure 3G:
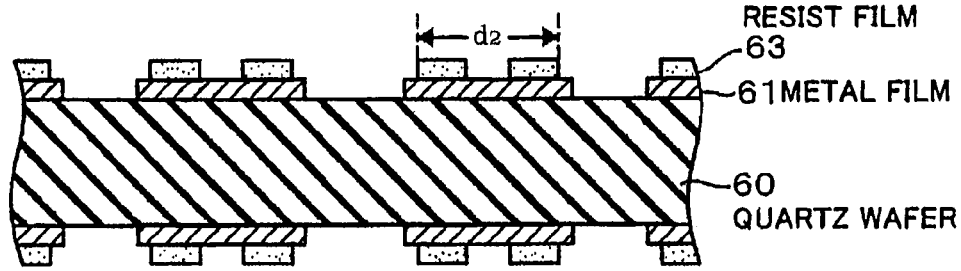
Figure 3H:
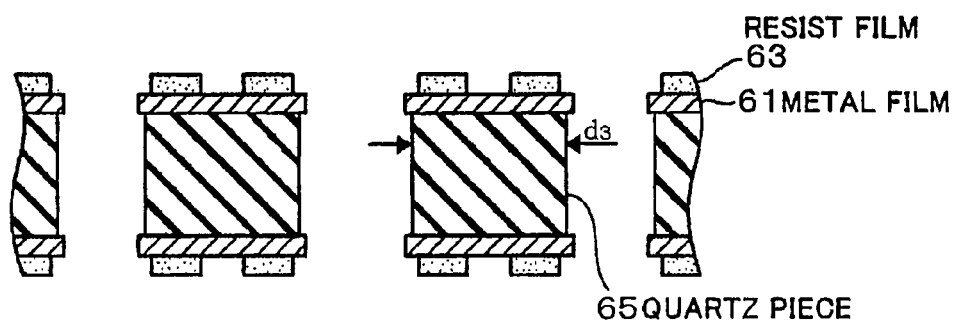

Then, the quartz wafer 60 is immersed in hydrofluoric acid serving as an etching solution to form the outer shape of the quartz piece 65 (FIG. 3H). The dimension d3 of the outer shape of the quartz piece 65 is formed conforming to the pattern of the metal film 61, and since the etching also progresses in the x direction (in the horizontal direction in the drawing), the dimension of the outer shape of the quartz piece 65 is smaller than the dimension d1 of the pattern of the metal film 61 by, for instance, 5 μm on each side as shown in the above-described drawing.

Figure 3I:
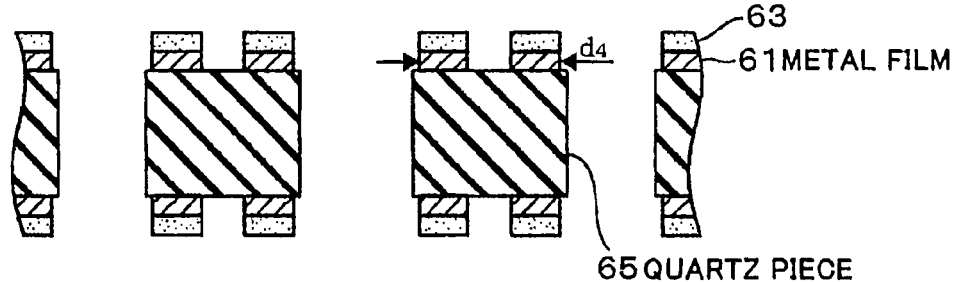

Then, the quartz wafer 60 is immersed in a potassium iodide (KI) solution to form an opening conforming to the groove 31 in the metal film 61 (FIG. 3I). Since the edge of the pattern of the metal film 61 is also eroded similarly by this etching, the dimension of the pattern of the metal film 61 decreases to d4 nearly the same as the dimension of the pattern of the resist film 63 from the dimension d1 formed by the etching in the above-described FIG. 2E. At this time, since the end of the metal film 61 is etched conforming to the pattern of the resist film 63 formed straightly, it is also straight, and is in a state almost without projections, depressions or waves. Since the ends of the metal film 61 and the resist film 63 are held on the quartz piece 65, they hardly move vertically even be stirring of the etching solution and shaking of the quartz piece 65, so that the dimension d2 of the resist film 63 is transferred to the metal film 61.

Figure 3J:
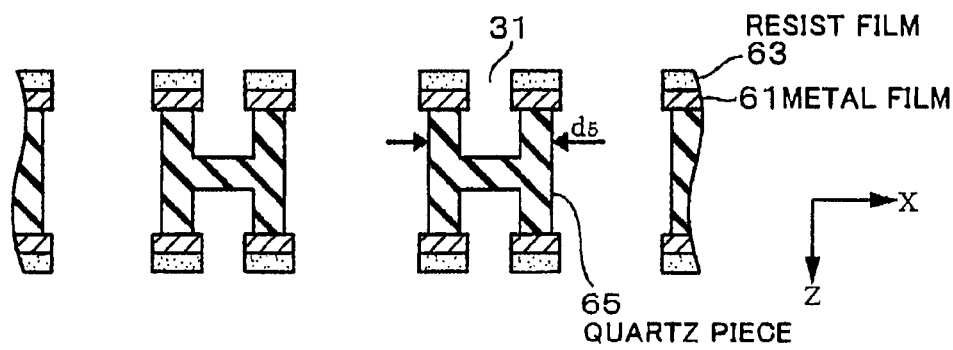

Next, the quartz wafer 60 is immersed in hydrofluoric acid and the grooves 31 are formed on both main surfaces 22 and 22 of the quartz piece 65 (FIG. 3J). Since the dimension d3 of the outer shape of the quartz piece 65 formed by the etching in FIG. 3H is larger than the dimension d4 of the pattern of the metal film 61, the dimension d3 also becomes small according to the shape of the pattern of the metal film 61. The dimension d5 in FIG. 3J is the outer shape of the quarts piece 65 when the grooves 31 are formed on both main surfaces 22 and 22 of the quartz piece 65. Since the edge line of the quartz piece 65 follows the edge line of the pattern of the metal film 61 which is nearly straight as described above, it is itself nearly straight, which results in the favorable state of having the outer shape and the CI value of the quartz resonator 5 nearly close to designed values. Note that since etching progresses also in the x direction (in the horizontal direction in the drawing) in this step, the quartz piece 65 is formed to be narrower than the pattern of the metal film 61.

Figure 4K:
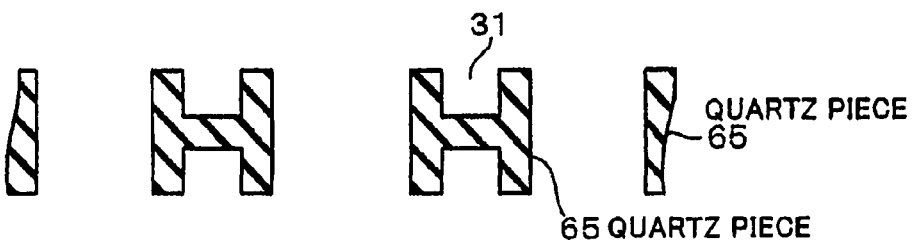
FIGS. 4K, 4L, 4M, 4N and 4O show an example of a method of manufacturing a quartz resonator as shown in FIG. 1 and show sections of the quartz resonator on a plane A passing through the groove 31 parallel to the x-z plane in FIG. 1.
Figure 4L:
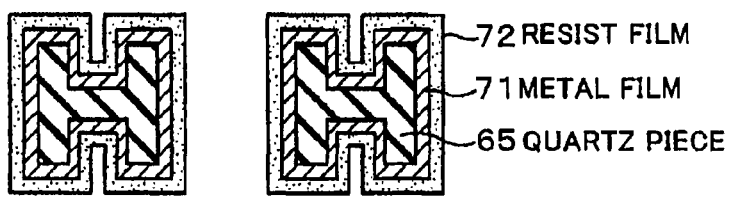

Thereafter, the resist film 63 and the metal film 61 are removed (FIG. 4K). By the above-described steps, the quartz piece 65 without electrode pattern is obtained.

Figure 4M:
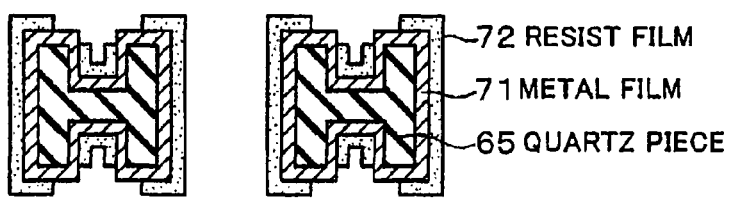
Figure 4N:
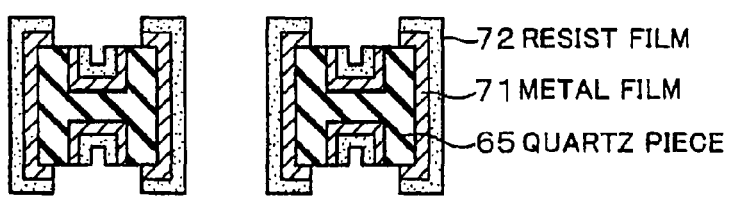
Figure 4O:
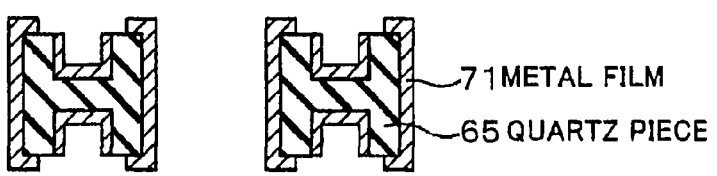
Figure 4O:
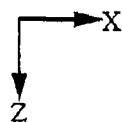
Figure 5:
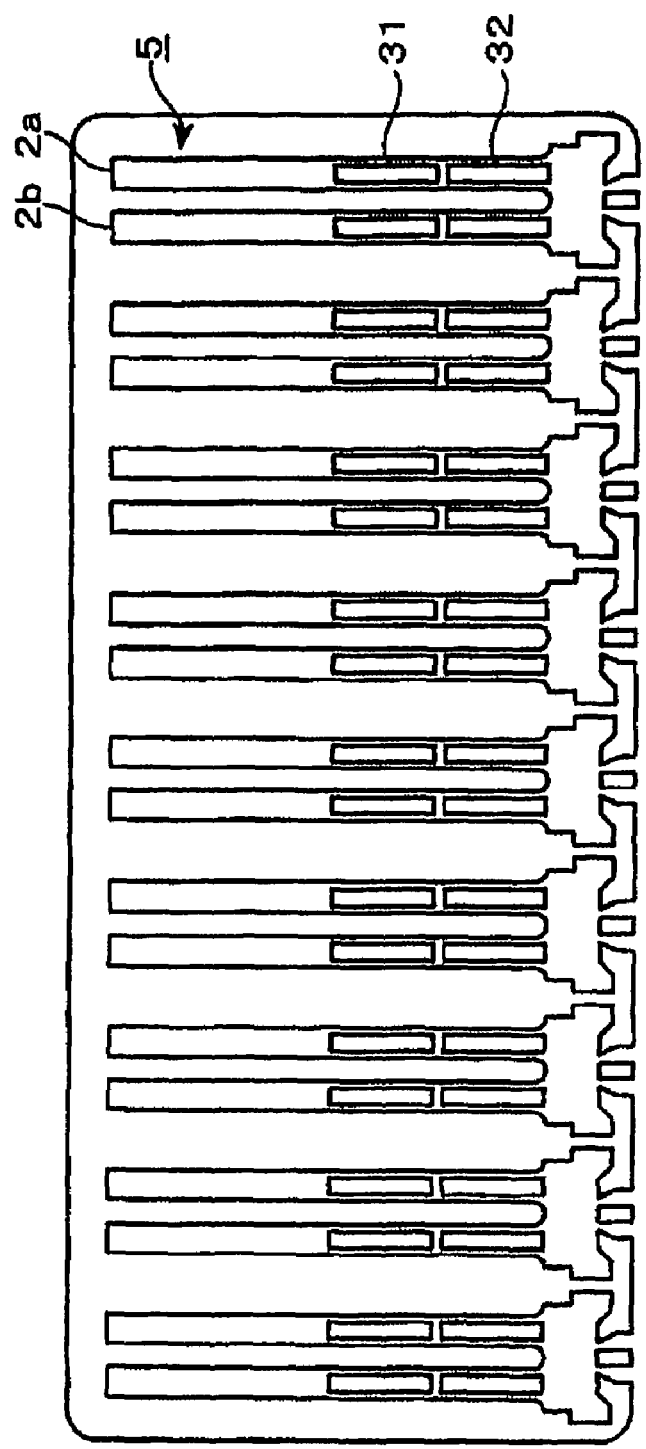
FIG. 5 is a view showing an example of the prototype of the above-described tuning fork type quartz resonator.

Next, the step to form an electrode pattern will be explained. First, a metal film 71 which will be the electrode, and a resist film 72 are stacked in this order by using, for instance, the sputtering method on both surfaces of the quartz piece 65 (FIG. 4I). The metal film 71 consists of gold (Au) deposited on a backing film made of, for instance, chromium (Cr). The resist film 72 is formed similarly by the above-described method in this instance, the spray method. Thereafter, the resist film 72 is patterned in a manner to correspond to the electrode pattern of the main surfaces 22 and 22 of the vibrating arms 2a and 2b (FIG. 4M). Then, after forming an electrode pattern on the metal film 71 using the resist film 72 as a mask by etching (FIG. 4N), the resist film 72 is peeled off (FIG. 4O). Thereafter, as shown in FIG. 5, the quartz resonator 5 is cut out from a substrate on which a plurality of quartz resonators 5 are formed. Note that the line formed so as to surround a plurality of quartz resonators 5 in FIG. 5 indicates a boundary between the substrate and the recess formed by etching.

When the adjusting weights 50 and 40 provided on the tips of the vibrating arms 2a and 2b in FIG. 1 are formed, the following steps must be conducted. First, after conducting etching of the quartz piece 65 in FIG. 3J, the resist film 63 is removed. Then, after forming photoresist on the surface of the quartz piece 65 by, for instance, the spray method, the photoresist excepting for the tips of the vibrating arms 2a and 2b is removed by exposure and development processing. Then, the quartz piece 65 is immersed in a potassium iodide solution, and after the metal film 61 except for the tips of the vibrating arms 2a and 2b is removed, the photoresist is peeled off. After this step, the steps for forming electrode patterns after the above-described FIG. 4K are performed.

According to the above-described embodiment of the present invention, when the grooves 31 and 32 are formed on the quartz wafer 60, the dimension d2 of the pattern of the resist film 63 is made smaller than the dimension d3 of the quartz piece 65 formed thereafter. Therefore, when openings conforming to the grooves 31 and 32 are formed in the metal film 61, the dimension d1 of the pattern of the metal film 61 gets smaller to d4 corresponding to the dimension d2 of the pattern of the resist film 63. Since this makes the quartz piece 65 smaller corresponding to the outer shape of the metal film 61 having a straight edge line when the groove 31 is formed on the quartz wafer 60 in FIG. 3J, it is possible to reduce appearance defects and dimension defects. The dimension d5 of the quartz piece 65 is formed with reference to the dimension d4 of the pattern of the metal film 61, not to the dimension d3 of the quartz piece 65 which could produce variations between batches. Therefore, the variation in the dimensions of the quartz resonator 5 between batches is reduced and yield is improved.

It is preferable that the dimension d2 of the pattern of the resist film 63 in FIG. 3G is smaller than the dimension d1 of the pattern of the metal film 61 on each one side by 3 μm to 12 μm from considerations of expense as against effectiveness between raw material cost of quartz crystal, time for the etching, and so on, and accuracy in dimension of the quartz resonator 5, yield, and so on. It is further preferable that the dimension d2 is smaller than the dimension d3 of the outer shape of the quartz piece 65 on each one side by 1 μm to 4 μm. In other words, it is because the dimension d2 of the pattern of the resist film 63 becomes large, the edge line of the outer shape of the quartz piece 65 loses linearity while as the dimension d2 of the pattern of the resist film 63 becomes small, the etching margin of the quartz wafer 60 gets bigger, which greatly increases waste of raw materials and prolongs the time required for etching, resulting in lower productivity.

Figure 6A:
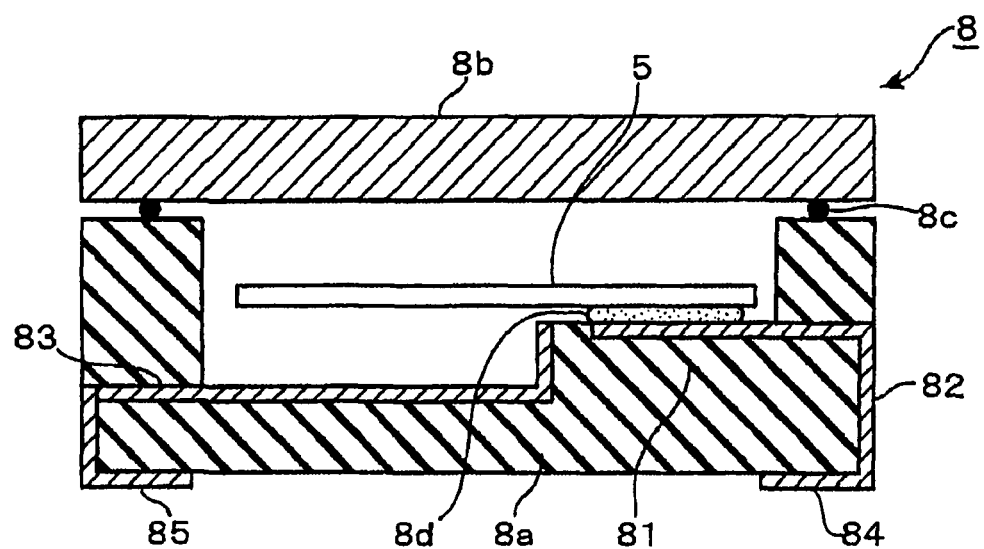
FIG. 6A is a sectional view of an example of a package to house the above-mentioned turning fork type quartz resonator.
Figure 6B:
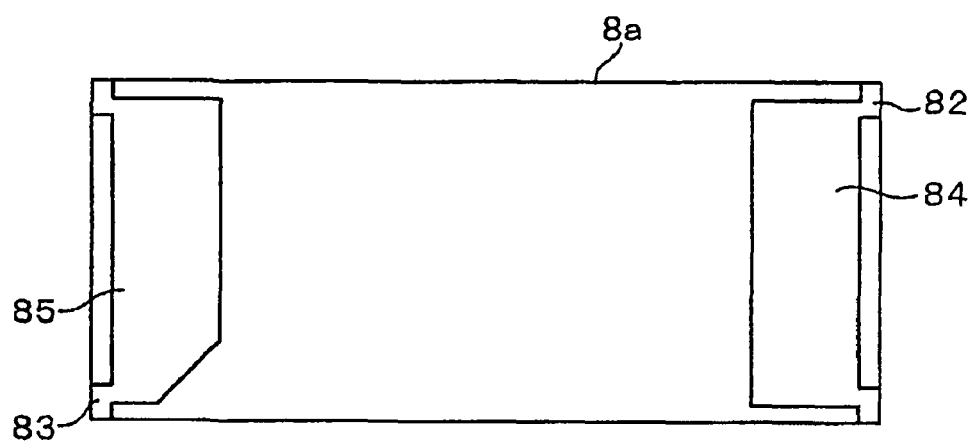
FIG. 6B is another view of the quartz resonator shown in FIG. 6A.

The above-described quartz resonator 5 is, as shown in FIG. 6 for instance, housed in a package 8 consisting of ceramics in an SMD (surface mounted device) structure to form an electronic part. The package 8 is composed of: a case 8a made of, for instance, ceramics, and having an opening in the upper surface; and a lid 8b made of, for instance, metal. The case 8a and the lid 8b are seam welded via a seal agent 8c, for instance, consisting of a welding agent so that the inside thereof is in a vacuum state. The base 1 of the quartz resonator 5 is fixed to a pedestal 81 in the package 8 by a conductive adhesive 8d, and the quartz resonator takes a horizontal posture in which the vibrating arms 2a and 2b extend into the space inside the package 8. The pull-out electrodes 42 and 52 of the base 1 are respectively connected to conductive paths 82 and 83 (83 is a conductive path on the inner side of this paper) formed on the surface of the pedestal 81. The conductive paths 82 and 83 are respectively connected to electrodes 84 and 85 formed on both ends in the longitudinal direction of the outside bottom of the case 8a, and the quartz resonator 5 is structured to oscillate by the electricity flowing through the pull-out electrodes 42 and 52 via the electrodes 84 and 85, the conductive paths 82 and 83, and the conductive adhesive 8d. The quartz resonator of this electronic part is structured by being installed on a circuit board (not shown) on which circuit parts of oscillating circuits are mounted.

What is claimed is:

1. A method of manufacturing a piezoelectric resonator provided with grooves formed on each of a plurality of vibrating arms extending from the base, comprising the steps of:

forming a metal film on the surface of a substrate, a piezoelectric substrate;

forming a first resist film patterned so as to retain the shape of the piezoelectric resonator on the surface of the metal film to form a pattern on the metal film by etching;

peeling off said whole first resist film;

forming a second resist film having a pattern formed such that the edge thereof is positioned inside of the edge of the pattern of said metal film by 3 μm to 12 μm at least at the part corresponding to the vibrating arm, and the part conforming to the groove of the vibrating arm is opened;

next, forming the outer shape of the piezoelectric resonator using said metal film as a mask by bringing said substrate into contact with the etching solution;

etching to remove the metal film at the part conforming to the groove of said vibrating arm and to remove the metal film outside of the outer shape of said second resist film, using said second resist film as a mask; and etching the outer shape of the vibrating arm to a shape conforming to the outer shape of said metal film by bringing said substrate into contact with an etching solution to form grooves respectively in said plural vibrating arms and to remove the part extending to the outside of the edge of the metal film on the vibrating arm using said metal film as a mask, the outer edge of the piezoelectric resonator being positioned inside the outer edge of the metal film being and positioned at 1 μm to 4 μm outside the edge of the resist film when the step of forming the outer shape of the piezoelectric resonator using said metal film as a mask is completed.

2. The method of manufacturing the piezoelectric resonator according to claim 1, after the step of etching to form grooves respectively in said plural vibrating arms and to form the outer shape of the vibrating arm into the shape according to the outer shape of said metal film, further comprising the steps of:

removing said resist film and the metal film;

forming a metal film to serve as an electrode in the area including the grooves formed on said plural vibrating arms;

forming an electrode pattern by etching the metal film by forming a resist film patterned on the surface of the metal film; and peeling off said whole resist film.

3. The method of manufacturing the piezoelectric resonator according to claim 1, wherein said piezoelectric resonator is formed from a tuning fork type quartz piece.

* * * * *